(12) United States Patent
Yuan et al.

(10) Patent No.: US 10,714,931 B2
(45) Date of Patent: Jul. 14, 2020

(54) ELECTROSTATIC PROTECTION CIRCUIT, ARRAY SUBSTRATE AND DISPLAY DEVICE

(71) Applicants: BOE TECHNOLOGY GROUP CO., LTD., Beijing (CN); HEFEI XINSHENG OPTOELECTRONICS TECHNOLOGY CO., LTD., Hefei, Anhui (CN)

(72) Inventors: Zhidong Yuan, Beijing (CN); Can Yuan, Beijing (CN); Yongqian Li, Beijing (CN); Xuehuan Feng, Beijing (CN)

(73) Assignees: BOE TECHNOLOGY GROUP CO., LTD., Beijing (CN); HEFEI XINSHENG OPTOELECTRONICS TECHNOLOGY CO., LTD., Hefei, Anhui (CN)

( * ) Notice: Subject to any disclaimer, the term of this patent is extended or adjusted under 35 U.S.C. 154(b) by 408 days.

(21) Appl. No.: 15/865,988

(22) Filed: Jan. 9, 2018

(65) Prior Publication Data
US 2018/0342864 A1    Nov. 29, 2018

(30) Foreign Application Priority Data

May 25, 2017  (CN) .......................... 2017 1 0381279

(51) Int. Cl.
*H02H 9/04* (2006.01)
*H01L 27/02* (2006.01)
(Continued)

(52) U.S. Cl.
CPC ......... *H02H 9/041* (2013.01); *H01L 27/0266* (2013.01); *H01L 27/0296* (2013.01);
(Continued)

(58) Field of Classification Search
CPC ............. H01L 27/0266; H01L 27/0281; H01L 27/0288; H01L 27/0296; H01L 27/124;
(Continued)

(56) References Cited

U.S. PATENT DOCUMENTS 5,606,340 A * 2/1997 Suzuki ................. G09G 3/3688
345/87
5,671,026 A * 9/1997 Shiraki ............... G02F 1/13454
349/40

(Continued)

FOREIGN PATENT DOCUMENTS

EP          1041634 A1 * 10/2000 ......... H01L 27/0629

*Primary Examiner* — Jared Fureman
*Assistant Examiner* — Christopher J Clark
(74) *Attorney, Agent, or Firm* — Foley & Lardner LLP

(57) ABSTRACT

The present disclosure relates to an electrostatic protection circuit, an array substrate and a display device, comprising: a first electrostatic discharge circuit and a second electrostatic discharge circuit; wherein the first electrostatic discharge circuit is configured to, in case that an electrostatic voltage formed on the first signal wire is greater than or equal to a first preset turn-on voltage, transmit the electrostatic voltage on the first signal wire to the second signal wire. In case that the electrostatic voltage formed on the first signal wire is greater than or equal to a second preset turn-on voltage, the first electrostatic discharge circuit couples the voltage on the first signal wire to a first node, so that the second electrostatic discharge circuit transmits the electrostatic voltage on the first signal wire to the second signal wire.

20 Claims, 5 Drawing Sheets

(51) Int. Cl.
*H01L 27/12* (2006.01)
*H01L 29/786* (2006.01)
*G09G 3/20* (2006.01)
*G02F 1/1362* (2006.01)

(52) U.S. Cl.
CPC ...... H01L 27/1214 (2013.01); H01L 27/1244 (2013.01); H02H 9/044 (2013.01); *G02F 1/136204* (2013.01); *G09G 3/20* (2013.01); *G09G 2300/0426* (2013.01); *G09G 2330/00* (2013.01); *G09G 2330/04* (2013.01); *H01L 29/786* (2013.01); *H02H 9/046* (2013.01)

(58) Field of Classification Search
CPC .......... H01L 27/1244; H02H 9/04–046; G02F 1/36204
See application file for complete search history.

(56) References Cited

U.S. PATENT DOCUMENTS

| | | | | |
|---|---|---|---|---|
| 5,841,490 A | * | 11/1998 | Matsuo | G02F 1/136204 |
| | | | | 349/40 |
| 2008/0123004 A1 | * | 5/2008 | Lin | G09G 3/20 |
| | | | | 349/40 |
| 2016/0172846 A1 | * | 6/2016 | Kotani | H02H 9/04 |
| | | | | 361/56 |
| 2018/0316185 A1 | * | 11/2018 | Lai | G11C 7/062 |

* cited by examiner

ELECTROSTATIC PROTECTION CIRCUIT, ARRAY SUBSTRATE AND DISPLAY DEVICE

CROSS-REFERENCE TO RELATED APPLICATIONS

The present application claims priority to China Patent Application No. 201710381279.6 filed on May 25, 2017, the disclosure of which is incorporated by reference herein in its entirety.

TECHNICAL FIELD

The present disclosure relates to an electrostatic protection circuit, an array substrate and a display device.

BACKGROUND

A general display panel includes a Thin-Film Transistor (TFT) for driving a display, a data wire for transmitting a data signal and a gate wire for transmitting a gate scan signal, and in the display panel, the data wire and the gate wire are generally arranged to be crossed and insulated. However, since electrostatic charges will be generated on the data wire and the gate wire during the process of manufacture, transport or use of the display panel, electrostatic discharge will occur when there are too many electrostatic charges on the data wire and the gate wire which are crossed mutually, so that an insulation layer located between the data wire and the gate wire is broken down, which causes the data wire and the gate wire which should be insulated to be conducted, thereby resulting in malfunction of the display panel.

SUMMARY

Some embodiments of the present disclosure provide an electrostatic protection circuit comprising: a first electrostatic discharge circuit and a second electrostatic discharge circuit; wherein the first electrostatic discharge circuit comprises a first end connected to a first signal wire, a second end connected to a first node, and a third end connected to a second signal wire, the first electrostatic discharge circuit is configured to, in case that an electrostatic voltage formed on the first signal wire is greater than or equal to a first preset turn-on voltage, transmit the electrostatic voltage on the first signal wire to the second signal wire, and couple the electrostatic voltage on the first signal wire to the first node; wherein the second electrostatic discharge circuit comprises a first end connected to the first signal wire, a second end connected to the first node, and a third end connected to the second signal wire, wherein the second electrostatic discharge circuit is configured to, in case that the electrostatic voltage formed on the first signal wire is greater than or equal to a second preset turn-on voltage, transmit the electrostatic voltage on the first signal wire to the second signal wire; wherein the second preset turn-on voltage is higher than the first preset turn-on voltage.

Some embodiments of the present disclosure also provide an array substrate which includes any of the above mentioned electrostatic protection circuits.

Accordingly, an embodiment of the present disclosure also provides a display device which includes any of the above mentioned array substrates provided by an embodiment of the present disclosure.

DETAILED DESCRIPTION

In order to make goals, technical solutions and advantages of the present disclosure more clear, specific embodiments of an electrostatic protection circuit, an electrostatic protection method, an array substrate and a display device provided by some embodiments of the present disclosure are explained in detail in conjunction with the drawings below. It should be understood that preferable embodiment described below are only for illustrating and explaining the present disclosure, and not to limit the present disclosure. And in a case where there is no conflict, embodiments in this application and features in embodiments may be combined with each other.

At present, in some display panels, an electrostatic protection circuit is generally provided on the data wire or the gate wire, so as to protect stable transmission of signals on these signal wires (the data wire or the gate wire). In a practical application, in order to avoid the electrostatic protection circuit imposing a negative effect on normal transmission of signals on the connected signal wires, the electrostatic protection circuit therefore needs to have a relatively low leakage characteristic. However, when a large number of electrostatic charges exist in the signal wire, the above mentioned electrostatic protection circuit with the relatively low leakage characteristic discharges the static electricity at a slow speed, which results in large local current, which in turn brings damages to the electrostatic protection circuit.

Figure 1:
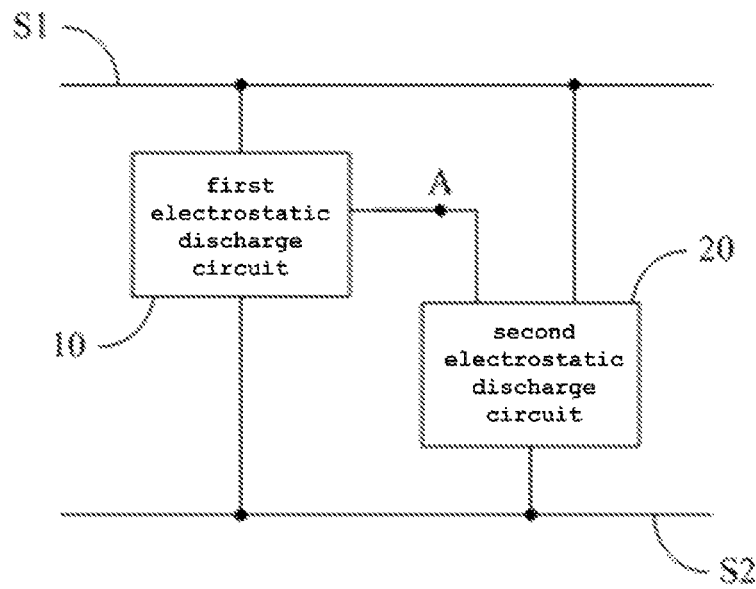
FIG. 1 is a schematic diagram of an electrostatic protection circuit provided by some embodiments of the present disclosure.

Some embodiments of the present disclosure provide an electrostatic protection circuit, as shown in FIG. 1, which includes a first electrostatic discharge circuit 10 and a second electrostatic discharge circuit 20;

wherein the first electrostatic discharge circuit 10 has a first end connected with a first signal wire S1, a second end connected with a first node A, and a third end connected with a second signal wire S2, the first electrostatic discharge circuit 10 is configured to, when an electrostatic voltage formed on the first signal wire S1 is greater than or equal to a first preset turn-on voltage, transmit the electrostatic voltage on the first signal wire S1 to the second signal wire S2 and couple the electrostatic voltage on the first signal wire S1 to the first node A;

the second electrostatic discharge circuit 20 has a first end connected with the first signal wire S1, a second end connected with the first node A, and a third end connected with the second signal wire S2, the second electrostatic discharge circuit 20 is configured to, when the electrostatic voltage formed on the first signal wire S1 is greater than or equal to a second preset turn-on voltage, transmit the electrostatic voltage on the first signal wire S1 to the second signal wire S2; wherein the second preset turn-on voltage is higher than the first preset turn-on voltage.

The above mentioned electrostatic protection circuit provided by some embodiments of the present disclosure includes: the first electrostatic discharge circuit and the second electrostatic discharge circuit; wherein the first electrostatic discharge circuit is configured to, when the electrostatic voltage formed on the first signal wire is greater than or equal to the first preset turn-on voltage, transmit the electrostatic voltage on the first signal wire to the second signal wire, so as to discharge static electricity. When the electrostatic voltage formed on the first signal wire is greater than or equal to the first preset turn-on voltage and less than the second preset turn-on voltage, the first electrostatic discharge circuit couples the electrostatic voltage on the first signal wire to the first node, to control the second electrostatic discharge circuit to be turned off. When the electrostatic voltage formed on the first signal wire is greater than or equal to the second preset turn-on voltage, the first electrostatic discharge circuit couples the voltage on the first signal wire to the first node, so as to cause the second electrostatic discharge circuit to transmit the electrostatic voltage on the first signal wire to the second signal wire, and since the second preset turn-on voltage is greater than the first preset turn-on voltage, when the electrostatic voltage on the first signal wire is large, the second electrostatic discharge circuit is turned on to discharge static electricity quickly, avoiding damage to the electrostatic protection circuit.

For example, in the above mentioned electrostatic protection circuit provided by some embodiments of the present disclosure, the second preset turn-on voltage is greater than the first preset turn-on voltage, for example, the first preset turn-on voltage may be 4.2V, the second preset turn-on voltage may be 21V. Of course, in a practical application, different signal wires need different effects of electrostatic protection, therefore, specific values of the first preset turn-on voltage and the second preset turn-on voltage need to be set and determined according to the actual function of the electrostatic protection, which is limited herein.

Figure 2:
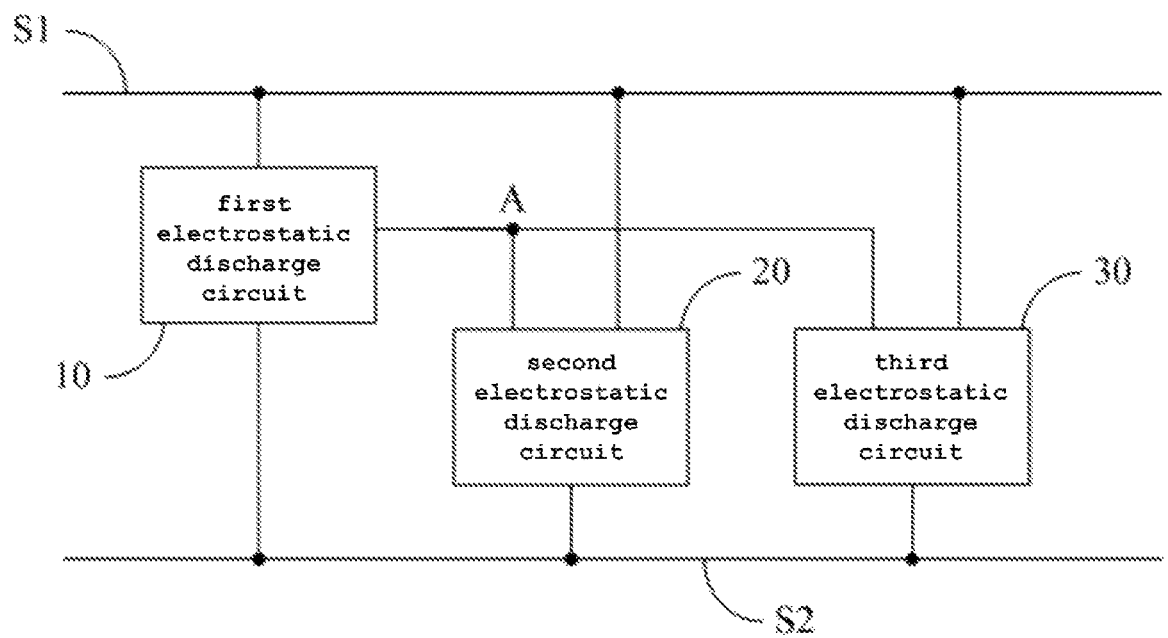
FIG. 2 is a schematic diagram of an electrostatic protection circuit provided by some embodiments of the present disclosure.

In order to further discharge static electricity on the first signal wire quickly, for example, in the above mentioned electrostatic protection circuit provided by some embodiments of the present disclosure, as shown in FIG. 2, the electrostatic protection circuit may also include: a third electrostatic discharge circuit 30; wherein the third electrostatic discharge circuit 30 has a first end connected with the first signal wire S1, a second end connected with the first node A, and a third end connected with the second signal wire S2, the third electrostatic discharge circuit 30 is configured to, when the electrostatic voltage formed on the first signal wire S1 is greater than or equal to a third preset turn-on voltage, transmit the electrostatic voltage on the first signal wire S1 to the second signal wire S2; wherein the third preset turn-on voltage is greater than or equal to the second preset turn-on voltage.

For example, in the above mentioned electrostatic protection circuit provided by some embodiments of the present disclosure, when the third preset turn-on voltage is equal to the second preset turn-on voltage, the third electrostatic discharge circuit and the second electrostatic discharge circuit are turned on simultaneously to discharge static electricity on the first signal wire through two discharge paths; when the third preset turn-on voltage is higher than the second preset turn-on voltage, the third electrostatic discharge circuit is turned on to discharge static electricity, so that more channels are adopted to discharge static electricity on the first signal wire, avoiding damage to the electrostatic protection circuit.

Figure 3:
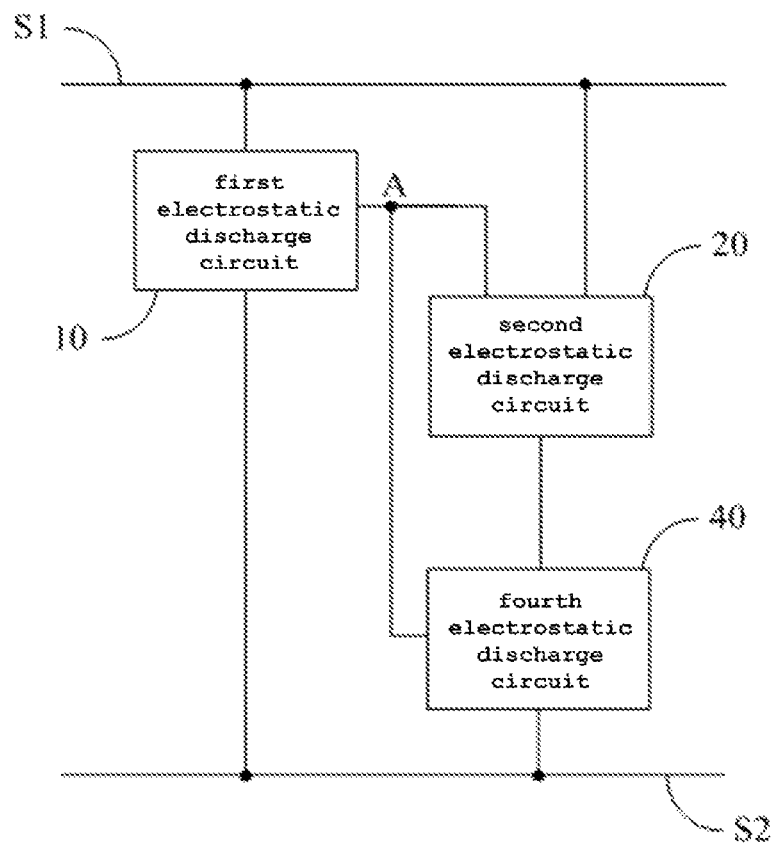
FIG. 3 is a schematic diagram of an electrostatic protection circuit provided by some embodiments of the present disclosure.

For example, in the above mentioned electrostatic protection circuit provided by some embodiments of the present disclosure, as shown in FIG. 3, the electrostatic protection circuit may also include: a fourth electrostatic discharge circuit 40; wherein the third end of the second electrostatic discharge circuit 20 is connected with the second signal wire S2 through the fourth electrostatic discharge circuit 40;

the fourth electrostatic discharge circuit 40 is also connected with the first node A, and is configured to, when the electrostatic voltage formed on the first signal wire S1 is greater than or equal to a fourth preset turn-on voltage, connect the third end of the second electrostatic discharge circuit 20 and the second signal wire S2; wherein, the fourth preset turn-on voltage is less than or equal to the second preset turn-on voltage.

For example, in the above mentioned electrostatic protection circuit provided by some embodiments of the present disclosure, when the fourth preset turn-on voltage is equal to the second preset turn-on voltage, the second electrostatic discharge circuit and the fourth electrostatic discharge circuit are turned on simultaneously to discharge the electrostatic voltage formed on the first signal wire through the turned on second electrostatic discharge circuit and fourth electrostatic discharge circuit. When the fourth preset turn-on voltage is less than the second preset turn-on voltage, the fourth electrostatic discharge circuit is first turned on to cause conduction between the third end of the first electrostatic discharge circuit and the second signal wire, the first electrostatic discharge circuit is turned on or turned off according to the relationship between the second preset turn-on voltage and the electrostatic voltage formed on the first signal wire.

Hereinafter, the present disclosure is explained in detail in conjunction with specific embodiments. It is to be noted that, the present embodiments are for explaining the present disclosure better, but not to limit the present disclosure.

Figure 4A:
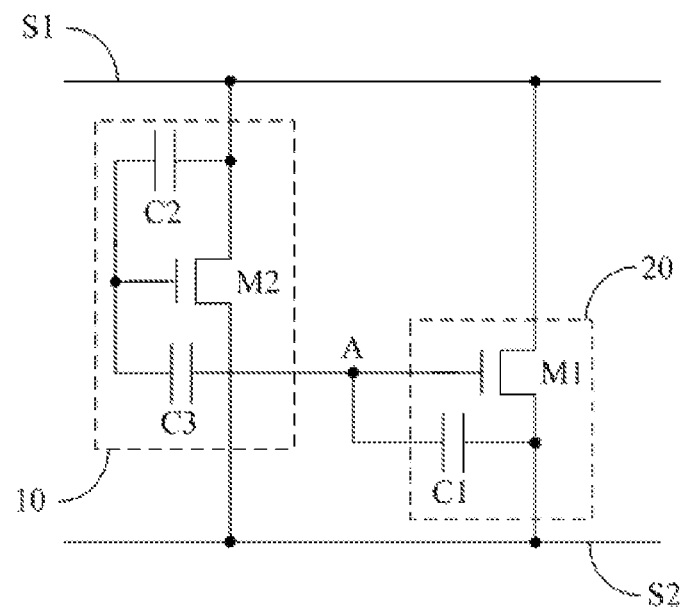
FIG. 4a is a schematic diagram of the electrostatic protection circuit shown in FIG. 1.
Figure 4B:
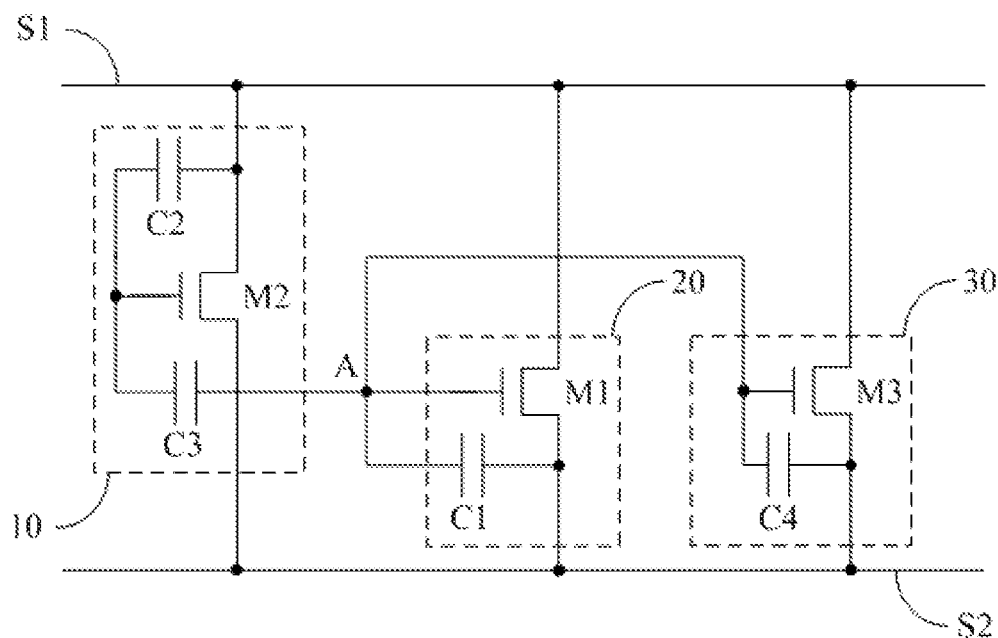
FIG. 4b is a schematic diagram of the electrostatic protection circuit shown in FIG. 2.
Figure 4C:
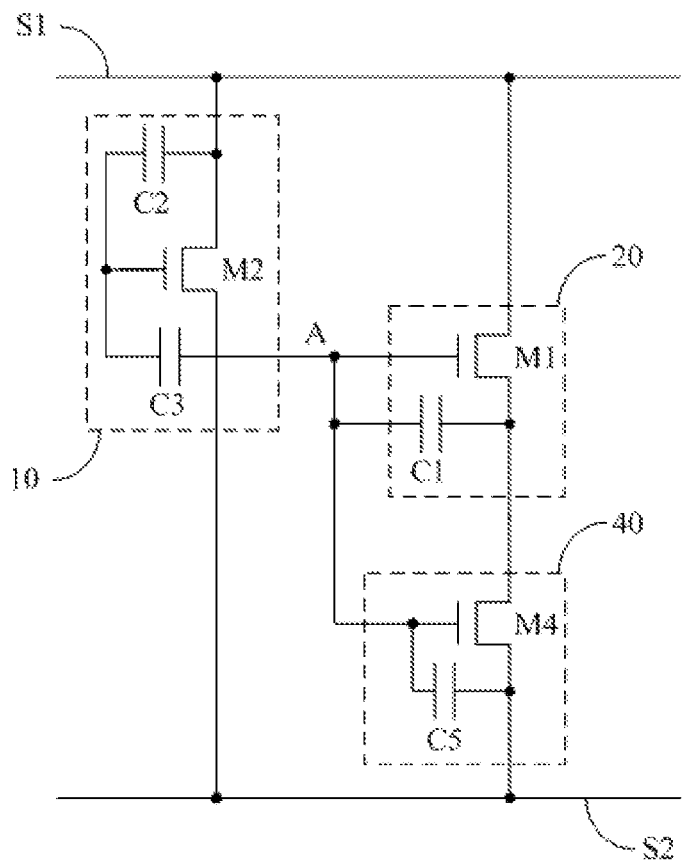
FIG. 4c is a schematic diagram of the electrostatic protection circuit shown in FIG. 3.

For example, in the above mentioned electrostatic protection circuit provided by some embodiments of the present disclosure, as shown in FIGS. 4a to 4c, the first electrostatic discharge circuit 10 may specifically include: a second transistor M2, a second capacitor C2 and a third capacitor C3; wherein, the second transistor M2 has a control electrode connected with a first end of the second capacitor C2 and a first end of the third capacitor C3 respectively, a first electrode connected with the first signal wire S1, and a second electrode connected with the second signal wire S2;

a second end of the second capacitor C2 is connected with the first signal wire S1;

a second end of the third capacitor C3 is connected with the first node A.

For example, in the above mentioned electrostatic protection circuit provided by some embodiments of the present disclosure, as shown in FIGS. 4a to 4c, the second transistor M2 may be a N type transistor. Of course, the second transistor may also be a P type transistor, which is not limited herein.

Generally, a signal wire is used to transmit a signal, and in order to avoid a negative effect on the signal transmitted on the signal wire by the electrostatic protection circuit forming a leakage current, for example, in the above mentioned electrostatic protection circuit provided by some embodiments of the present disclosure, the second transistor is a bottom-gate type transistor. That is, when the second transistor is arranged on a base substrate, a gate of the second transistor is located at a side of its active layer facing the base substrate.

For example, in the above mentioned electrostatic protection circuit provided by some embodiments of the present disclosure, when the electrostatic voltage formed on the first signal wire is greater than or equal to the first preset turn-on voltage, the coupling of the second capacitor and the third capacitor causes the control electrode of the second transistor to have a certain voltage to control the second transistor to be in a conductive state, so that the electrostatic voltage formed on the first signal wire is discharged to the second signal wire. And due to the coupling of the second capacitor and the third capacitor, the electrostatic voltage on the first signal wire may be coupled to the first node, which causes the first node to have a certain voltage.

For example, in the above mentioned electrostatic protection circuit provided by some embodiments of the present disclosure, as shown in FIGS. 4a and 4b, the second electrostatic discharge circuit 20 may specifically include: a first transistor M1 and a first capacitor C1; wherein, the first transistor M1 has a control electrode connected with the first node A, a first electrode connected with the first signal wire S1, and a second electrode connected with the second signal wire S2;

the first capacitor C1 has a first end connected with the first node A, and a second end connected with the second electrode of the first transistor M1.

For example, in the above mentioned electrostatic protection circuit provided by some embodiments of the present disclosure, as shown in FIGS. 4a and 4b, the first transistor M1 may be a N type transistor. Of course, the first transistor may also be a P type transistor, which is not limited herein.

When there is too much static electricity on the first signal wire, in order to discharge static electricity more quickly to protect the electrostatic protection circuit, for example, in the above mentioned electrostatic protection circuit provided by some embodiments of the present disclosure, the first transistor is a top-gate type transistor. That is, when the first transistor is arranged on the base substrate, the gate of the first transistor is located at a side of its active layer opposed to the base substrate.

For example, in the above mentioned electrostatic protection circuit provided by some embodiments of the present disclosure, a length of the channel region of the active layer of the first transistor in the second electrostatic discharge circuit is shorter than a length of the channel region of the active layer of the second transistor in the first electrostatic discharge circuit.

For example, in the above mentioned electrostatic protection circuit provided by some embodiments of the present disclosure, when the electrostatic voltage formed on the first signal wire is greater than or equal to the second preset turn-on voltage, the electrostatic voltage formed on the first signal wire causes the first node to have a certain voltage through coupling, so that the first transistor is in a conductive state under the control of the voltage of the first node, so as to discharge electrostatic charges formed on the first signal wire to the second signal wire.

For example, in the above mentioned electrostatic protection circuit provided by some embodiments of the present disclosure, as shown in FIG. 4b, the third electrostatic discharge circuit 30 may specifically include: a third transistor M3 and a fourth capacitor C4; wherein, the third transistor M3 has a control electrode connected with the first node A, a first electrode connected with the first signal wire S1, and a second electrode connected with the second signal wire S2;

the fourth capacitor C4 has a first end connected with the first node A, and a second end connected with the second signal wire S2.

For example, in the above mentioned electrostatic protection circuit provided by some embodiments of the present disclosure, as shown in FIG. 4b, the third transistor M3 may be a N type transistor. Of course, the third transistor may also be a P type transistor, which is not limited herein.

For example, in the above mentioned electrostatic protection circuit provided by some embodiments of the present disclosure, it is possible to control the third preset turn-on voltage by controlling a threshold voltage of the third transistor. Of course, it is also possible to control the third preset turn-on voltage by controlling other characteristics, which is not limited herein.

For example, in the above mentioned electrostatic protection circuit provided by some embodiments of the present disclosure, the capacitance value of the fourth capacitor may be equal to the capacitance value of the first capacitor, which is not limited herein.

When there is too much static electricity on the first signal wire, in order to discharge static electricity more quickly to protect the circuit, for example, in the above mentioned electrostatic protection circuit provided by some embodiments of the present disclosure, the third transistor is a top-gate type transistor. That is, when the third transistor is arranged on the base substrate, the gate of the third transistor is located at a side of its active layer opposed to the base substrate.

For example, in the above mentioned electrostatic protection circuit provided by some embodiments of the present disclosure, the electrostatic voltage formed on the first signal wire causes the first node to have a certain voltage through coupling, when the electrostatic voltage formed on the first signal wire is greater than or equal to the third preset turn-on voltage, the third transistor is in a conductive state under the control of the voltage of the first node, so as to discharge the electrostatic charges formed on the first signal wire to the second signal wire.

For example, in the above mentioned electrostatic protection circuit provided by some embodiments of the present disclosure, as shown in FIG. 4c, when the electrostatic protection circuit further includes the fourth electrostatic discharge circuit 40, the third end of the second electrostatic discharge circuit 20 is connected with the second signal wire S2 through the fourth electrostatic discharge circuit 40. That is, the second electrode of the first transistor M1 in the second electrostatic discharge circuit 20 is connected with the second signal wire S2 through the fourth electrostatic discharge circuit 40. Wherein, the fourth electrostatic discharge circuit 40 may specifically include: a fourth transistor M4 and a fifth capacitor C5; wherein, the fourth transistor M4 has a control electrode connected with the first node A, a first electrode connected with the third end of the second electrostatic discharge circuit 20, and a second electrode connected with the second signal wire S2;

the fifth capacitor C5 has a first end connected with the first node A, and a second end connected with the second signal wire S2.

For example, in the above mentioned electrostatic protection circuit provided by some embodiments of the present disclosure, as shown in FIG. 4c, the fourth transistor M4 may be a N type transistor. Of course the fourth transistor may also be a P type transistor, which is not limited herein.

For example, in the above mentioned electrostatic protection circuit provided by some embodiments of the present disclosure, it is possible to control the fourth preset turn-on voltage by controlling a threshold voltage of the fourth transistor. Of course, it is also possible to control the fourth preset turn-on voltage by controlling other characteristics, which is not limited herein.

For example, in the above mentioned electrostatic protection circuit provided by some embodiments of the present disclosure, the capacitance value of the fifth capacitor may be equal to the capacitance value of the first capacitor, which is not limited herein.

For example, in the above mentioned electrostatic protection circuit provided by some embodiments of the present disclosure, the fourth transistor is in a conductive state under the control of the voltage of the first node, so that conduction is formed between the second electrode of the first transistor in the second electrostatic discharge circuit and the second signal wire to achieve the function of discharging static electricity.

The above description only exemplifies specific structures of respective circuits in the electrostatic protection circuit provided by some embodiments of the present disclosure. For example, the above mentioned specific structures of respective circuits are not limited to the above mentioned structures provided by some embodiments of the present disclosure, but they may also be other structures that may be known by those skilled in the art, which is not limited herein.

Preferably, in order to simplify the manufacturing process, for example, in the above mentioned electrostatic protection circuit provided by some embodiments of the present disclosure, as shown in FIGS. 4a to 4c, all the transistors may be N type transistors.

It is to be noted that respective transistors mentioned in the above mentioned embodiments of the present disclosure may be Thin Film Transistors (TFT), or Metal Oxide Semiconductor Field Effect (MOS) transistors, which is not limited herein. In specific implementations, with respect to the above mentioned respective transistor, according to its different type, it is possible to use the control electrode thereof as the gate, use the first electrode as the source or the drain, and use the second electrode as the drain or the source, which is not limited herein.

In the following, taking circuit structures shown in FIGS. 4a to 4c as well as the electrostatic voltage formed on the first signal wire S1 being $\Delta V_1$ as examples respectively, operating process of the above mentioned electrostatic protection circuit provided by some embodiments of the present disclosure is described.

Taking the structure shown in FIG. 4a as an example, in FIG. 4a, the electrostatic protection circuit includes 2 transistors and 3 capacitors. Through coupling of the first capacitor C1, the second capacitor C2 as well as the third capacitor C3, the voltage $V_{G1}$ of the first node A satisfies the formula:

$$V_{G1} = \frac{C_2 C_3}{C_1 C_2 + C_2 C_3 + C_1 C_3} \Delta V_1,$$

i.e. the voltage of the gate of the first transistor M1, wherein $c_1$ represents the capacitance of the first capacitor C1, $c_2$ represents the capacitance of the second capacitor C2, $c_3$ represents the capacitance of the third capacitor C3. Also, the voltage $V_{G2}$ of the gate of the second transistor M2 satisfies the formula:

$$V_{G2} = \frac{C_1 C_3}{C_1 C_2 + C_2 C_3 + C_1 C_3} \Delta V_1.$$

Since the relationship $c_3 = \alpha c_2$ is satisfied between $c_3$ and $c_2$; the relationship $c_1 = \beta c_2$ is satisfied between $c_1$ and $c_2$; where $\alpha$ and $\beta$ are parameters, it is possible to obtain:

$$V_{G1} = \frac{C_2 C_3}{C_1 C_2 + C_2 C_3 + C_1 C_3} \Delta V_1 = \frac{\alpha}{\alpha + \beta + \alpha\beta} \Delta V_1;$$

$$V_{G2} = \frac{C_1 C_3}{C_1 C_2 + C_2 C_3 + C_1 C_3} \Delta V_1 = \frac{\alpha\beta}{\alpha + \beta + \alpha\beta} \Delta V_1.$$

Since the first transistor M1 and the second transistor M2 have threshold voltages $V_{th}(M1)$ and $V_{th}(M2)$ respectively, it is therefore possible to set values of $\alpha$ and $\beta$, so that when $V_{G1} \geq V_{th}(M1)$, the first transistor M1 is controlled to be turned on; when $V_{G2} \geq V_{th}(M2)$, the second transistor M2 is controlled to be turned on.

Taking $\alpha=1$, $\beta=10$, $V_{th}(M1)=1V$, $V_{th}(M2)=2V$ as an example, according to $V_{G2} \geq V_{th}(M2)$, when $\Delta V_1 \geq 4.2V$, the second transistor M2 may be controlled to be turned on. According to $V_{G1} \geq V_{th}(M1)$, when $\Delta V_1 \geq 21V$, the first transistor M1 is controlled to be turned on. Therefore, for example, the first preset turn-on voltage $\Delta V_0(1)$ may be 4.2V at this time, the second preset turn-on voltage $\Delta V_0(2)$ may be 21V at this time, so that when $\Delta V_1$ increases to 4.2V, the second transistor M2 is turned on to discharge static electricity, and the first transistor M1 is turned off at this time. When $\Delta V_1$ increases to 21V, i.e. the electrostatic voltage formed on the first signal wire S1 is large, the first transistor M1 is turned on at this time to increase discharge paths so as to discharge static electricity quickly, so that it is possible to protect the circuit from being damaged.

Taking the structure shown in FIG. 4b as an example, in FIG. 4b, the electrostatic protection circuit includes 3 transistors and 4 capacitors. Through coupling of the first capacitor C1, the second capacitor C2, the third capacitor C3 and the fourth capacitor C4, the voltage $V_{G1}$ of the first node A satisfies the formula:

$$V_{G1} = \frac{C_2 C_3}{C_1 C_2 + C_2 C_3 + C_1 C_3} \Delta V_1,$$

i.e. the voltage of the gate of the first transistor M1, wherein $c_1$ represents the capacitance of the first capacitor C1, $c_2$ represents the capacitance of the second capacitor C2, $c_3$ represents the combined capacitance when the third capacitor C3 and the fourth capacitor C4 are connected in parallel. Also, the voltage $V_{G2}$ of the gate of the second transistor M2 and the gate of the third transistor M3 satisfies the formula:

$$V_{G2} = \frac{C_1 C_3}{C_1 C_2 + C_2 C_3 + C_1 C_3} \Delta V_1.$$

Since the relationship $c_3=\alpha c_2$ is satisfied between $c_3$ and $c_2$; the relationship $c_1=\beta c_2$ is satisfied between $c_1$ and $c_2$; where, $\alpha$ and $\beta$ are parameters, it is possible to obtain:

$$V_{G1} = \frac{C_2 C_3}{C_1 C_2 + C_2 C_3 + C_1 C_3} \Delta V_1 = \frac{\alpha}{\alpha + \beta + \alpha\beta} \Delta V_1;$$

$$V_{G2} = \frac{C_1 C_3}{C_1 C_2 + C_2 C_3 + C_1 C_3} \Delta V_1 = \frac{\alpha\beta}{\alpha + \beta + \alpha\beta} \Delta V_1.$$

Since the first transistor M1, the second transistor M2 and the third transistor M3 have threshold voltages $V_{th}$(M1), $V_{th}$(M2), $V_{th}$(M3) respectively, it is therefore possible to set values of $\alpha$ and $\beta$, so that when $V_{G1} \geq V_{th}$(M1), the first transistor M1 is controlled to be turned on; when $V_{G2} \geq V_{th}$(M2), the second transistor M2 is controlled to be turned on; when $V_{G1} \geq V_{th}$(M3), the third transistor M3 is controlled to be turned on.

Taking $\alpha=1$, $\beta=10$, $V_{th}$(M1)=1V, $V_{th}$(M2)=2V, $V_{th}$(M3)=1.5V as an example, according to $V_{G2} \geq V_{th}$(M2), when $\Delta V_1 \geq 4.2V$, the second transistor M2 may be controlled to be turned on. According to $V_{G1} \geq V_{th}$(M1), when $\Delta V_1 \geq 21V$, the first transistor M1 is controlled to be turned on. According to $V_{G1} \geq V_{th}$(M3), when $\Delta V_1 \geq 31.5V$, the third transistor M3 is controlled to be turned on. Therefore, the first preset turn-on voltage $\Delta V_0(1)$ may be 4.2V at this time, the second preset turn-on voltage $\Delta V_0(2)$ may be 21V at this time, the third preset turn-on voltage $\Delta V_0(3)$ may be 31.5V at this time. Thereby, when $\Delta V_1$ increases to 4.2V, the second transistor M2 is turned on to discharge static electricity, and both the first transistor M1 and the third transistor M3 are turned off at this time. When $\Delta V_1$ increases to 21V, the first transistor M1 is turned on to increase discharge paths so as to discharge static electricity quickly. When $\Delta V_1$ increases to 31.5 V, the third transistor M3 is turned on to increase discharge paths so as to discharge static electricity quickly, so that it is possible to protect the circuit from being damaged.

Taking the structure shown in FIG. 4c as an example, in FIG. 4c, the electrostatic protection circuit includes 3 transistors and 4 capacitors. Through coupling of the first capacitor C1, the second capacitor C2, the third capacitor C3 and the fifth capacitor C5, the voltage $V_{G1}$ of the first node A satisfies the formula:

$$V_{G1} = \frac{C_2 C_3}{C_1 C_2 + C_2 C_3 + C_1 C_3} \Delta V_1,$$

i.e. the voltage of the gate of the first transistor M1, wherein $c_1$ represents the capacitance of the first capacitor C1, $c_2$ represents the capacitance of the second capacitor C2, $c_3$ represents the combined capacitance when the third capacitor C3 and the fifth capacitor C5 are connected in parallel. Also, the voltage $V_{G2}$ of the gate of the second transistor M2 and the gate of the fourth transistor M4 satisfies the formula:

$$V_{G2} = \frac{C_1 C_3}{C_1 C_2 + C_2 C_3 + C_1 C_3} \Delta V_1.$$

Since the relationship $c_3=\alpha c_2$ is satisfied between $c_3$ and $c_2$; the relationship $c_1=\beta c_2$ is satisfied between $c_1$ and $c_2$; where, $\alpha$ and $\beta$ are parameters, it is possible to obtain:

$$V_{G1} = \frac{C_2 C_3}{C_1 C_2 + C_2 C_3 + C_1 C_3} \Delta V_1 = \frac{\alpha}{\alpha + \beta + \alpha\beta} \Delta V_1;$$

$$V_{G2} = \frac{C_1 C_3}{C_1 C_2 + C_2 C_3 + C_1 C_3} \Delta V_1 = \frac{\alpha\beta}{\alpha + \beta + \alpha\beta} \Delta V_1.$$

Since the first transistor M1, the second transistor M2 and the fourth transistor M4 have threshold voltages $V_{th}$(M1), $V_{th}$(M2), $V_{th}$(M4) respectively, it is therefore possible to set values of $\alpha$ and $\beta$, so that when $V_{G1} \geq V_{th}$(M1), the first transistor M1 is controlled to be turned on; when $V_{G2} \geq V_{th}$(M2), the second transistor M2 is controlled to be turned on; when $V_{G1} \geq V_{th}$(M4), the fourth transistor M4 is controlled to be turned on.

Taking $\alpha=1$, $\beta=10$, $V_{th}$(M1)=1V, $V_{th}$(M2)=2V, $V_{th}$(M4)=0.5V as an example, according to $V_{G2} \geq V_{th}$(M2), when $\Delta V_1 \geq 4.2V$, the second transistor M2 may be controlled to be turned on. According to $V_{G1} \geq V_{th}$(M4), when $\Delta V_1 \geq 10.5V$, the fourth transistor M4 may be controlled to be turned on. According to $V_{G1} \geq V_{th}$(M1), when $\Delta V_1 \geq 21V$, the first transistor M1 is controlled to be turned on. Therefore, the first preset turn-on voltage $\Delta V_0(1)$ may be 4.2V at this time, the second preset turn-on voltage $\Delta V_0(2)$ may be 21V at this time, the fourth preset turn-on voltage $\Delta V_0(4)$ may be 10.5V at this time. Thereby, when $\Delta V_1$ increases to 4.2V, the second transistor M2 is turned on to discharge static electricity, and both the first transistor M1 and the fourth transistor M4 are turned off at this time. When $\Delta V_1$ increases to 10.5V, the fourth transistor M4 is preferentially turned on. When $\Delta V_1$ increases to 21V, the first transistor M1 is also turned on, so that, by use of the turned on fourth transistor M4 and first transistor M1, discharge paths are increased to discharge static electricity quickly, so that it is possible to protect the circuit from being damaged.

Figure 5:
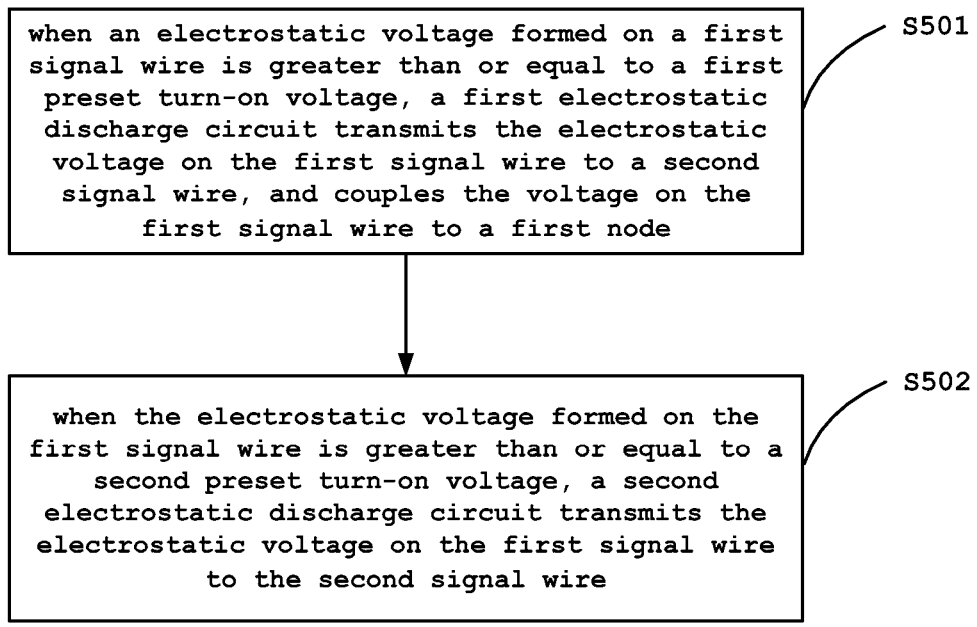
FIG. 5 is a flow chart of an electrostatic protection method provided by some embodiments of the present disclosure.

Based on the same inventive concept, some embodiments of the present disclosure also provide an electrostatic protection method which adopts any of the above mentioned electrostatic protection circuits provided by some embodiments of the present disclosure, as shown in FIG. 5, the electrostatic protection method includes:

S501. when an electrostatic voltage formed on a first signal wire is greater than or equal to a first preset turn-on voltage, a first electrostatic discharge circuit transmitting the electrostatic voltage on the first signal wire to a second signal wire, and coupling the voltage on the first signal wire to a first node;

S502. when the electrostatic voltage formed on the first signal wire is greater than or equal to a second preset turn-on voltage, a second electrostatic discharge circuit transmitting the electrostatic voltage on the first signal wire to the second signal wire.

In the above mentioned electrostatic protection method provided by some embodiments of the present disclosure, when the electrostatic voltage formed on the first signal wire is greater than or equal to the first preset turn-on voltage, the electrostatic voltage on the first signal wire is transmitted to the second signal wire through the first electrostatic discharge circuit, so as to discharge static electricity. When the electrostatic voltage formed on the first signal wire is greater than or equal to the first preset turn-on voltage and less than the second preset turn-on voltage, the first electrostatic discharge circuit couples the electrostatic voltage on the first signal wire to the first node, to control the second electrostatic discharge circuit to be turned off. When the electrostatic voltage formed on the first signal wire is greater than or equal to the second preset turn-on voltage, the first electrostatic discharge circuit couples the voltage on the first signal wire to the first node, so as to cause the second electrostatic discharge circuit to transmit the electrostatic voltage on the first signal wire to the second signal wire, and since the second preset turn-on voltage is higher than the first preset turn-on voltage, when the electrostatic voltage on the first signal wire is large, the second electrostatic discharge circuit is controlled to be turned on to discharge static electricity quickly, thereby avoiding damage to the electrostatic protection circuit.

For example, in the above mentioned method provided by some embodiments of the present disclosure, when the electrostatic voltage formed on the first signal wire is greater than or equal to the second preset turn-on voltage, the method further includes: a third electrostatic discharge circuit transmitting the electrostatic voltage on the first signal wire to the second signal wire.

For example, in the above mentioned method provided by some embodiments of the present disclosure, when the electrostatic voltage formed on the first signal wire is greater than or equal to the second preset turn-on voltage, the method further includes: a fourth electrostatic discharge circuit forms conduction between a third end of the second electrostatic discharge circuit and the second signal wire.

Based on the same inventive concept, some embodiments of the present disclosure also provide an array substrate which includes any of the above mentioned electrostatic protection circuits provided by some embodiments of the present disclosure. The principle by which the array substrate solves problems is similar to that of the aforementioned electrostatic protection circuit, therefore, the implementation of the array substrate may refer to the implementation of the aforementioned electrostatic protection circuit, repeated description is not provided here again.

For example, in the above mentioned array substrate provided by some embodiments of the present disclosure, the electrostatic protection circuit may specifically include: a first transistor, a second transistor, a first capacitor, a second capacitor as well as a third capacitor; wherein, the first transistor has a control electrode connected with the first node, a first electrode connected with the first signal wire, and a second electrode connected with the second signal wire;

the second transistor has a control electrode connected with a first end of the second capacitor and a first end of the third capacitor respectively, a first electrode connected with the first signal wire, and a second electrode connected with the second signal wire;

the first capacitor has a first end connected with the first node, and a second end connected with the second electrode of the first transistor;

a second end of the second capacitor is connected with the first signal wire;

a second end of the third capacitor is connected with the first node.

Figure 6:
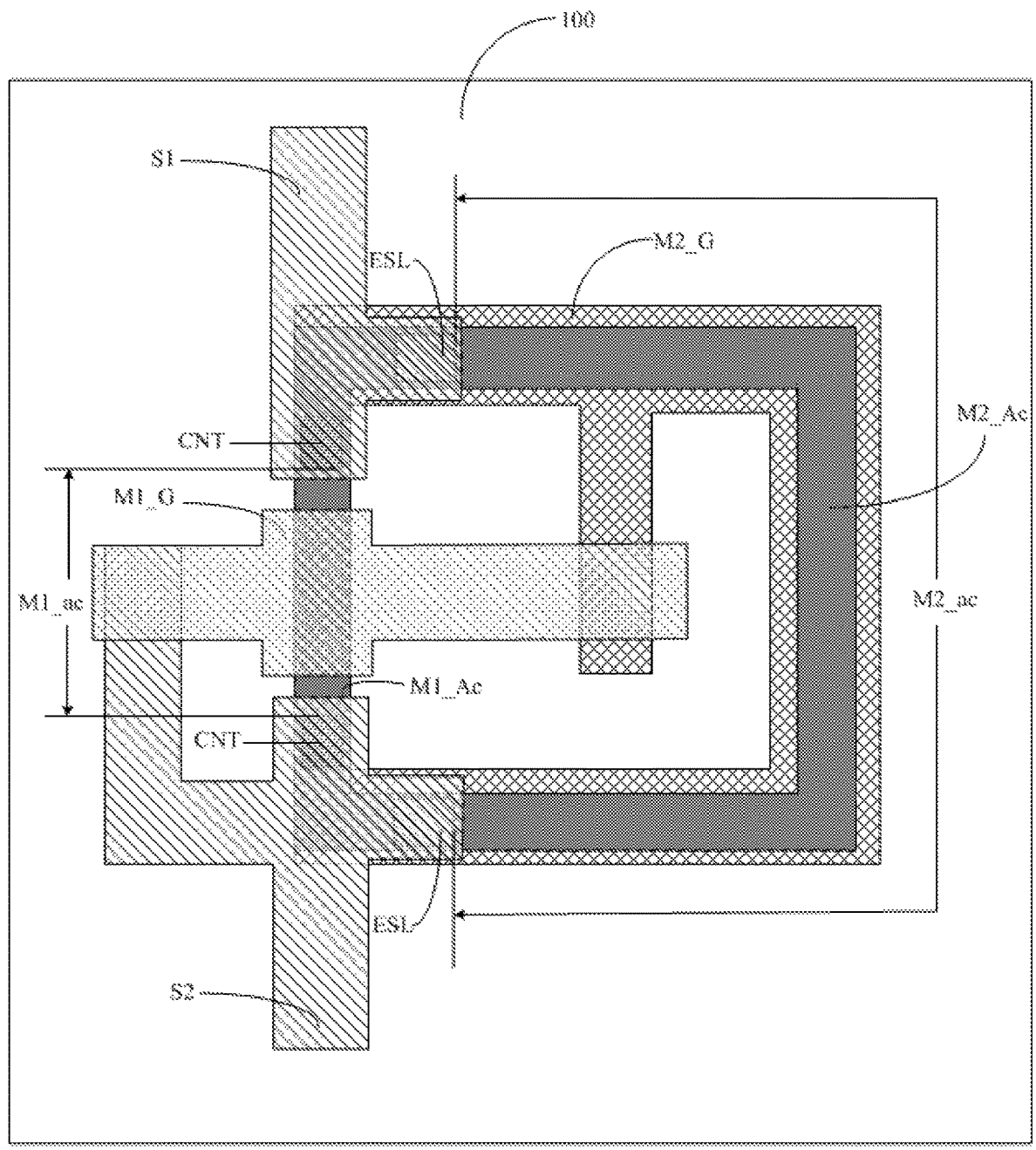
FIG. 6 is a layout diagram of the electrostatic protection circuit shown in FIG. 4a provided on a base substrate.

For example, in the above mentioned array substrate provided by some embodiments of the present disclosure, the array substrate further includes a base substrate on which the above mentioned respective transistors are arranged. In a practical manufacturing process, the above mentioned respective transistors and respective capacitors are generally arranged on the base substrate. For example, in the above mentioned array substrate provided by some embodiments of the present disclosure, as shown in FIG. 6, the drawing is a layout diagram of the first signal wire S1, the second signal wire S2, the first transistor M1, the second transistor M2 on the base substrate 100. The first transistor M1 is a top-gate type transistor, the second transistor M2 is a bottom-gate type transistor. The second transistor M2 includes: a gate M2_G located at a side of the base substrate 100, an active layer M2_Ac located at a side of the gate M2_G opposed to the array substrate 100, a source (not shown in FIG. 6) and a drain (not shown in FIG. 6) located at a side of the active layer M2_Ac opposed to the array substrate 100. The source and the drain are electrically connected with the first signal wire S1 and the second signal wire S2 respectively through a first via ESL, and also electrically connected with the active layer M2_Ac through the first via ESL, wherein, the source of the second transistor M2 is electrically connected with the first signal wire S1, the drain of the second transistor M2 is electrically connected with the second signal wire S2. The first transistor M1 includes: a source (not shown in FIG. 6) and a drain (not shown in FIG. 6) of the first transistor M1 arranged on the same layer as the source and the drain of the second transistor M2, an active layer M1_Ac of the first transistor M1 arranged on the same layer as the active layer M2_Ac of second transistor M2, as well as a gate M1_G of the first transistor M1 located at a side of the active layer M1_Ac of the first transistor M1 opposed to the array substrate 100, wherein, the source and the drain of the first transistor M1 are electrically connected with the first signal wire S1 and the second signal wire S2 respectively through a second via CNT, and the active layer M1_Ac is also electrically connected with the source and the drain of the first transistor M1 through the second via CNT, the source of the first transistor M1 is electrically connected with the first signal wire S1, the drain of the first transistor M1 is electrically connected with the second signal wire S2. The active layer M1_Ac of the first transistor M1 and the active layer M2_Ac of the second transistor M2 are a "mouth" shape integral structure.

In FIG. 6, the gate M1_G of first transistor M1 has two ends which extend in a horizontal direction, wherein the right end is used as the second end of the third capacitor, the left end is used as the first end of the first capacitor. A portion of the gate M2_G of the second transistor M2 which extends in a vertical direction may be used as the second end of the third capacitor. One end of the second signal wire S2 which extends to the left may be used as the second end of the first capacitor. The second capacitor may be formed by a overlapped portion of the first signal wire S1 and the gate M2_G of the second transistor M2 overlap.

For example, in the above mentioned array substrate provided by some embodiments of the present disclosure, as shown in FIG. 6, a length of the channel region M1_ac of the active layer M1_Ac of the first transistor M1 is shorter than a length of the channel region M2_ac of the active layer M2_Ac of the second transistor M2. Thus, the first transistor M1 is enabled to discharge the charges quickly, and the second transistor M2 is enabled to have a low leakage current characteristic.

For example, in the above mentioned array substrate provided by some embodiments of the present disclosure, the first signal wire and the second signal wire are arranged to be adjacent, and both the first signal wire and the second signal wire are gate wires; or, both the first signal wire and the second signal wire are data wires, which is not limited herein. Of course, there are also some film layers such as insulation layers on the array substrate, all of which should be understood by those skilled in the art and are not repeated herein.

For example, steps of manufacturing the above mentioned array substrate provided by some embodiments of the present disclosure are as follows:

(1) adopting a patterning process to form the pattern of the gate of the second transistor on the base substrate.

(2) adopting a patterning process to form the pattern of the first insulation layer on the base substrate on which the gate of the second transistor is formed.

(3) adopting a patterning process to form the pattern of the active layer on the base substrate on which the pattern of the first gate insulation layer is formed; wherein the active layer is an frame shaped integral structure which includes the active layer of the first transistor and the active layer of the second transistor.

(4) adopting a patterning process to form the pattern of the second insulation layer having the first via and the second via on the base substrate on which the active layer in step (3) is formed.

(5) adopting a patterning process to form the pattern of the metal layer on the base substrate on which the second insulation layer is formed; wherein, the metal layer includes: the source and the drain of the first transistor and the source and the drain of the second transistor.

(6) adopting a patterning process to form the pattern of the third insulation layer on the base substrate on which the metal layer is formed.

(7) adopting a patterning process to form the pattern of the gate of the first transistor on the base substrate on which the third insulation layer is formed.

In the practical manufacturing, the patterning process may include a photolithographic process and an etching step, and at the same time, may further include other processes for forming a predetermined pattern, such as printing, ink jetting; the photolithographic process refers to a process which includes processes such as film forming, exposing, developing and forms a pattern by using photoresist, a mask, an exposure machine, etc. For example, it is possible to select a corresponding patterning process according to the structure formed in the present disclosure.

Based on the same inventive concept, some embodiments of the present disclosure also provide an display device which includes the above mentioned array substrate provided by some embodiments of the present disclosure. The display device may be any product or component, such as a cellphone, a tablet computer, a TV set, a display, a notebook computer, a digital photo frame, a navigator, which has a display function. All other necessary components of the display device are those that should be provided as understood by those ordinary skilled in the art, which are not repeated herein and not to be treated as limitations on the present disclosure either. And the implementation of the display device may refer to the embodiments of the above mentioned array substrate, repeated description is not provided here again.

The electrostatic protection circuit, the electrostatic protection method, the array substrate and the display device provided by some embodiments of the present disclosure include: a first electrostatic discharge circuit and a second electrostatic discharge circuit; wherein the first electrostatic discharge circuit is configured to, when the electrostatic voltage formed on the first signal wire is greater than or equal to the first preset turn-on voltage, transmit the electrostatic voltage on the first signal wire to the second signal wire, so as to discharge static electricity. When the electrostatic voltage formed on the first signal wire is greater than or equal to the first preset turn-on voltage and less than the second preset turn-on voltage, the first electrostatic discharge circuit couples the electrostatic voltage on the first signal wire to the first node, to control the second electrostatic discharge circuit to be turned off. When the electrostatic voltage formed on the first signal wire is greater than or equal to the second preset turn-on voltage, the first electrostatic discharge circuit couples the voltage on the first signal wire to the first node, so as to cause the second electrostatic discharge circuit to transmit the electrostatic voltage on the first signal wire to the second signal wire, and since the second preset turn-on voltage is higher than the first preset turn-on voltage, when the electrostatic voltage on the first signal wire is large, the second electrostatic discharge circuit is turned on to discharge static electricity quickly, avoiding damages to the electrostatic protection circuit.

Obviously, those skilled in the art may make various changes and modifications to the present disclosure without departing from the spirit and the scope of the present disclosure. Thus, if these changes and modifications to the present disclosure are within the scope of claims of the present disclosure and its equivalents, the present disclosure is also intended to cover these changes and modifications.

What is claimed is:

1. An electrostatic protection circuit comprising: a first electrostatic discharge circuit and a second electrostatic discharge circuit; wherein:
   the first electrostatic discharge circuit comprises a first end connected to a first signal wire, a second end connected to a first node, and a third end connected to a second signal wire, wherein the first electrostatic discharge circuit is configured to, in case that an electrostatic voltage formed on the first signal wire is greater than or equal to a first preset turn-on voltage, transmit the electrostatic voltage on the first signal wire to the second signal wire and couple the electrostatic voltage on the first signal wire to the first node;
   the second electrostatic discharge circuit comprises a first end connected to the first signal wire, a second end connected to the first node, and a third end connected to the second signal wire,
   wherein the second electrostatic discharge circuit is configured to, in case that the electrostatic voltage formed on the first signal wire is greater than or equal to a second preset turn-on voltage, transmit the electrostatic voltage on the first signal wire to the second signal wire; wherein the second preset turn-on voltage is higher than the first preset turn-on voltage.

2. The electrostatic protection circuit according to claim 1, wherein the second electrostatic discharge circuit includes: a first transistor and a first capacitor; wherein:
   the first transistor comprises a control electrode connected to the first node, a first electrode connected to the first signal wire, and a second electrode connected to the second signal wire;
   the first capacitor comprises a first end connected to the first node, and a second end connected to the second electrode of the first transistor.

3. The electrostatic protection circuit according to claim 2, wherein the first transistor is a top-gate type transistor.

4. The electrostatic protection circuit according to claim 1, wherein the first electrostatic discharge circuit includes: a second transistor, a second capacitor and a third capacitor; and wherein,
   the second transistor comprises a control electrode connected to a first end of the second capacitor and a first end of the third capacitor, a first electrode connected to the first signal wire, and a second electrode connected to the second signal wire;
   a second end of the second capacitor is connected to the first signal wire; and a second end of the third capacitor is connected to the first node.

5. The electrostatic protection circuit according to claim 4, wherein the second transistor is a bottom-gate type transistor.

6. The electrostatic protection circuit according to claim 1, wherein the electrostatic protection circuit further includes: a third electrostatic discharge circuit; and wherein:
the third electrostatic discharge circuit comprises a first end connected to the first signal wire, a second end connected to the first node, and a third end connected to the second signal wire,
the third electrostatic discharge circuit is configured to, in case that the electrostatic voltage formed on the first signal wire is greater than or equal to a third preset turn-on voltage, transmit the electrostatic voltage on the first signal wire to the second signal wire; wherein the third preset turn-on voltage is greater than or equal to the second preset turn-on voltage.

7. The electrostatic protection circuit according to claim 6, wherein the third electrostatic discharge circuit includes: a third transistor and a fourth capacitor; wherein:
the third transistor comprises a control electrode connected to the first node, a first electrode connected to the first signal wire, and a second electrode connected to the second signal wire; and
the fourth capacitor comprises a first end connected to the first node, and a second end connected to the second signal wire.

8. The electrostatic protection circuit according to claim 1, wherein the electrostatic protection circuit further includes: a fourth electrostatic discharge circuit, wherein:
the third end of the second electrostatic discharge circuit is connected to the second signal wire through the fourth electrostatic discharge circuit;
the fourth electrostatic discharge circuit is also connected to the first node, and is configured to, in case that the electrostatic voltage formed on the first signal wire is greater than or equal to a fourth preset turn-on voltage, cause conduction between the third end of the second electrostatic discharge circuit and the second signal wire; wherein the fourth preset turn-on voltage is less than or equal to the second preset turn-on voltage.

9. The electrostatic protection circuit according to claim 8, wherein the fourth electrostatic discharge circuit includes: a fourth transistor and a fifth capacitor; wherein:
the fourth transistor comprises a control electrode connected to the first node, a first electrode connected to the third end of the second electrostatic discharge circuit, and a second electrode connected to the second signal wire;
the fifth capacitor comprises a first end connected to the first node, and a second end connected to the second signal wire.

10. An array substrate comprising the electrostatic protection circuit according to claim 1.

11. The array substrate according to claim 10, wherein the second electrostatic discharge circuit includes: a first transistor and a first capacitor; wherein:
the first transistor comprises a control electrode connected to the first node, a first electrode connected to the first signal wire, and a second electrode connected to the second signal wire;
the first capacitor comprises a first end connected to the first node, and a second end connected to the second electrode of the first transistor.

12. The array substrate according to claim 11, wherein the first transistor is a top-gate type transistor.

13. The array substrate according to claim 10, wherein the first electrostatic discharge circuit includes: a second transistor, a second capacitor and a third capacitor; wherein:
the second transistor comprises a control electrode connected to a first end of the second capacitor and a first end of the third capacitor, a first electrode connected to the first signal wire, and a second electrode connected to the second signal wire;
a second end of the second capacitor is connected to the first signal wire;
a second end of the third capacitor is connected to the first node.

14. The array substrate according to claim 10, wherein the electrostatic protection circuit further includes: a third electrostatic discharge circuit; wherein:
the third discharge circuit comprises a first end connected to the first signal wire, a second end connected to the first node, and a third end connected to the second signal wire, the third electrostatic discharge circuit is configured to, in case that the electrostatic voltage formed on the first signal wire is greater than or equal to a third preset turn-on voltage, transmit the electrostatic voltage on the first signal wire to the second signal wire; wherein the third preset turn-on voltage is greater than or equal to the second preset turn-on voltage.

15. The array substrate according to claim 14, wherein the third electrostatic discharge circuit includes: a third transistor and a fourth capacitor; wherein:
the third transistor comprises a control electrode connected to the first node, a first electrode connected to the first signal wire, and a second electrode connected to the second signal wire;
the fourth capacitor comprises a first end connected to the first node, and a second end connected to the second signal wire.

16. The array substrate according to claim 10, wherein the electrostatic protection circuit further includes: a fourth electrostatic discharge circuit; wherein:
the third end of the second electrostatic discharge circuit is connected to the second signal wire through the fourth electrostatic discharge circuit;
the fourth electrostatic discharge circuit is also connected to the first node, and is configured to, in case that the electrostatic voltage formed on the first signal wire is greater than or equal to a fourth preset turn-on voltage, cause conduction between the third end of the second electrostatic discharge circuit and the second signal wire; wherein, the fourth preset turn-on voltage is less than or equal to the second preset turn-on voltage.

17. The array substrate according to claim 16, wherein the fourth electrostatic discharge circuit includes: a fourth transistor and a fifth capacitor; wherein:
the fourth transistor comprises a control electrode connected to the first node, a first electrode connected to the third end of the second electrostatic discharge circuit, and a second electrode connected to the second signal wire;
the fifth capacitor comprises a first end connected to the first node, and a second end connected to the second signal wire.

18. The array substrate according to claim 10, wherein the electrostatic protection circuit includes: a first transistor, a second transistor, a first capacitor, a second capacitor and a third capacitor; wherein:

the first transistor comprises a control electrode connected to the first node, a first electrode connected to the first signal wire, and a second electrode connected to the second signal wire;

the second transistor comprises a control electrode connected to a first end of the second capacitor and a first end of the third capacitor, a first electrode connected to the first signal wire, and a second electrode connected to the second signal wire;

the first capacitor comprises a first end connected to the first node, and a second end connected to the second electrode of the first transistor;

a second end of the second capacitor is connected to the first signal wire;

a second end of the third capacitor is connected to the first node.

19. The array substrate according to claim 18, wherein a length of a channel region of an active layer of the first transistor is shorter than a length of a channel region of an active layer of the second transistor.

20. A display device comprising the array substrate according to claim 10.

* * * * *